(12) United States Patent
Krogh

(10) Patent No.: US 6,821,350 B2
(45) Date of Patent: Nov. 23, 2004

(54) CLEANING PROCESS RESIDUES ON A PROCESS CHAMBER COMPONENT

(75) Inventor: Ole Krogh, Belmont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 10/056,299

(22) Filed: Jan. 23, 2002

(65) Prior Publication Data

US 2003/0136428 A1 Jul. 24, 2003

(51) Int. Cl.[7] .............................. B08B 3/04; B08B 3/08; B08B 5/02
(52) U.S. Cl. .............................. 134/3; 134/28; 134/30; 134/37; 134/41; 134/21
(58) Field of Search .............................. 134/28, 30, 41, 134/3, 22.12, 22.15, 25.4, 37, 21

(56) References Cited

U.S. PATENT DOCUMENTS

| | | |
|---|---|---|
| 4,491,496 A | 1/1985 | Laporte |
| 5,549,802 A | 8/1996 | Guo |
| 5,660,640 A | 8/1997 | Laube |
| 6,216,710 B1 | 4/2001 | White et al. |

FOREIGN PATENT DOCUMENTS

| | | |
|---|---|---|
| JP | 03229200 B2 | 10/1991 |
| JP | 07134090 B2 | 5/1995 |

OTHER PUBLICATIONS

PCT International Search Report for application No. PCT/US 02/37430, dated Mar. 3, 2003.
Ser. No.: 10/032,387; Inventors: He et al.; filing date: Dec. 21, 2001.
Ser. No.: 09/895,862; Inventors: Lin et al.; filing date: Jun. 27, 2001.

*Primary Examiner*—Zeinab El-Arini
(74) *Attorney, Agent, or Firm*—Janah & Associates

(57) ABSTRACT

A method of cleaning process residues from the surface of a substrate processing chamber component having holes. In the method, the component is at least partially immersed into a cleaning solution having hydrafluoric acid and nitric acid, and a non-reactive gas is passed through the holes to prevent the cleaning solution from back-flowing into the holes during the cleaning process. The method is particularly useful for cleaning sputtering residue deposits from an electrostatic chuck used in a sputtering process.

12 Claims, 2 Drawing Sheets

CLEANING PROCESS RESIDUES ON A PROCESS CHAMBER COMPONENT

BACKGROUND

Figure 1:
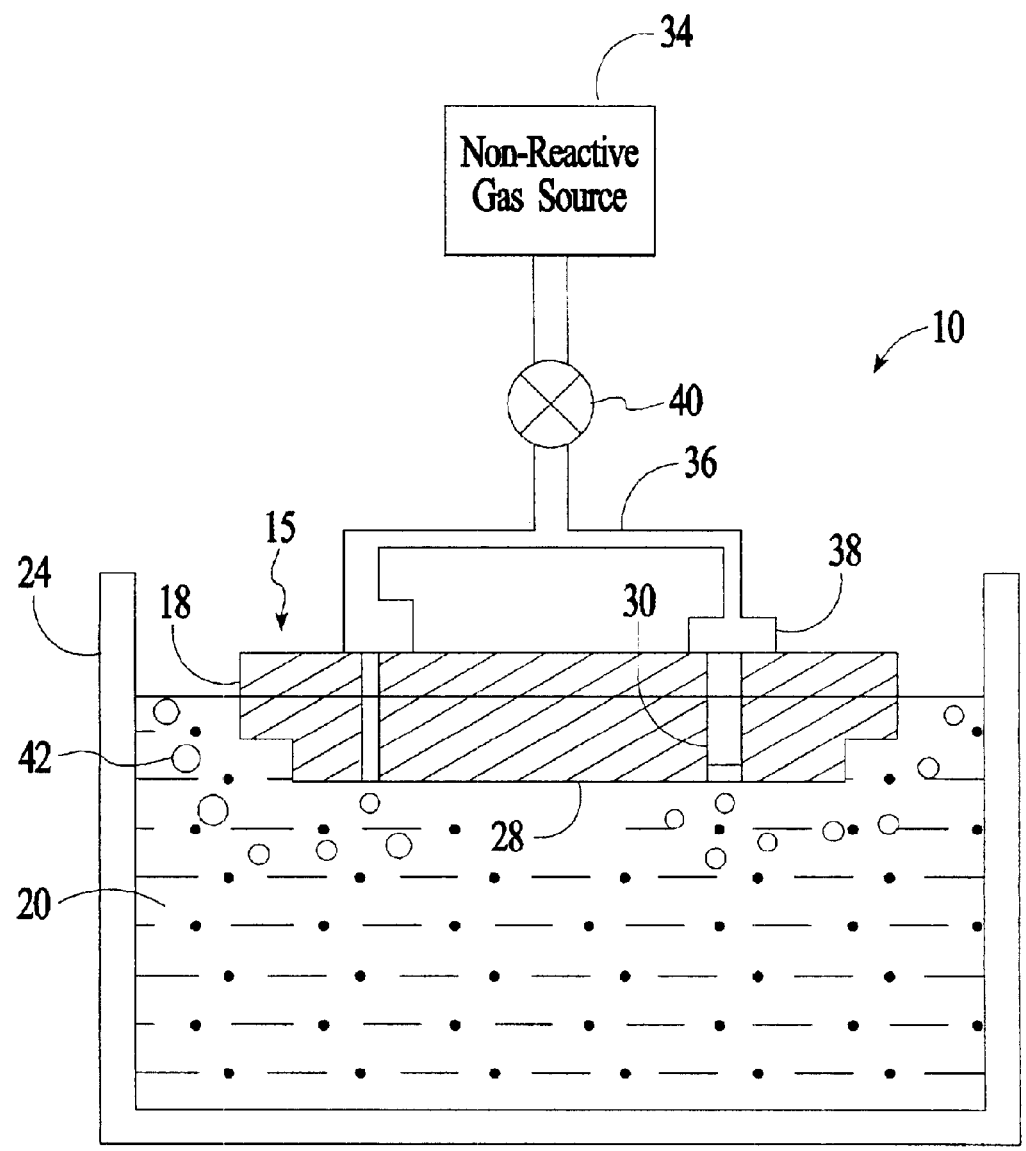

The present invention relates to the cleaning of process residues from chamber components that are used in substrate fabrication process chambers.

In the fabrication of electronic circuits, semiconductor, dielectric, and conductor materials, such as for example, polysilicon, silicon dioxide, aluminum or tungsten silicide, are formed on a substrate by, for example, chemical vapor deposition (CVD), physical vapor deposition (PVD), oxidation, and nitridation processes. In CVD processes, a reactive gas is used to deposit material on the substrate, and in PVD processes, a target is sputtered to deposit material on the substrate. In oxidation and nitridation processes, an oxide or nitride material, for example, silicon dioxide or silicon nitride, respectively, is formed on the substrate by exposing the substrate to a suitable gaseous environment. In subsequent processes, a patterned mask of etch-resistant material is formed on the substrate by lithographic methods, and the exposed portions of the substrate are etched by an energized gas to form patterns of gates, vias, contact holes or interconnect lines.

In these fabrication processes, process residues often deposit on the surfaces of the components in the chamber. The composition of the process residues may depend upon the composition of the process gas, the material being deposited or etched, and the composition of material on the substrate. Typically, the components are periodically removed from the chamber and cleaned with a solvent or an acidic or basic solution before being reassembled into the chamber. However, in certain fabrication processes, the process residues formed on the component have a composition that is difficult to clean, and consequently, they gradually accumulate on the component, eventually resulting in failure of the component. For example, when an electrostatic chuck forms the top portion of a substrate support and is exposed to the deposition of process residues, the residues deposit into the holes and other crevices of the electrostatic chuck to clog up the holes and result in failure of the chuck. Residues that have a chemically hard composition, such as sputtered material that deposits on the substrate support in certain PVD processes, are often difficult to clean off from the electrostatic chuck component that is in the line of sight of the sputtering target. Furthermore, when the cleaning solution comprises chemically aggressive solvents, the cleaning solution can damage the component during cleaning.

Thus, it is desirable to have a process to effectively clean process residues formed on a substrate processing chamber components, especially the chemically hard process residues. It is further desirable to prevent or reduce damage to the component during the cleaning process.

SUMMARY

A method of cleaning process residues from the surface of a substrate processing chamber component holes therein. In the method, the component is at least partially immersed into a cleaning solution comprising hydrofluoric acid and nitric acid, and a non-reactive gas is passed through the holes to prevent the cleaning solution from back-flowing into the holes during the cleaning process.

A method of cleaning sputtering residues from the surface of an electrostatic chuck having gas ports therein comprises at least partially immersing the electrostatic chuck into a cleaning solution comprising hydrofluoric acid in a concentration of at least about 1 percent and nitric acid in a concentration of at least about 20 percent; and flowing nitrogen through the gas ports in the electrostatic chuck at a pressure of at least about 2 psi.

DRAWINGS

Figure 2:
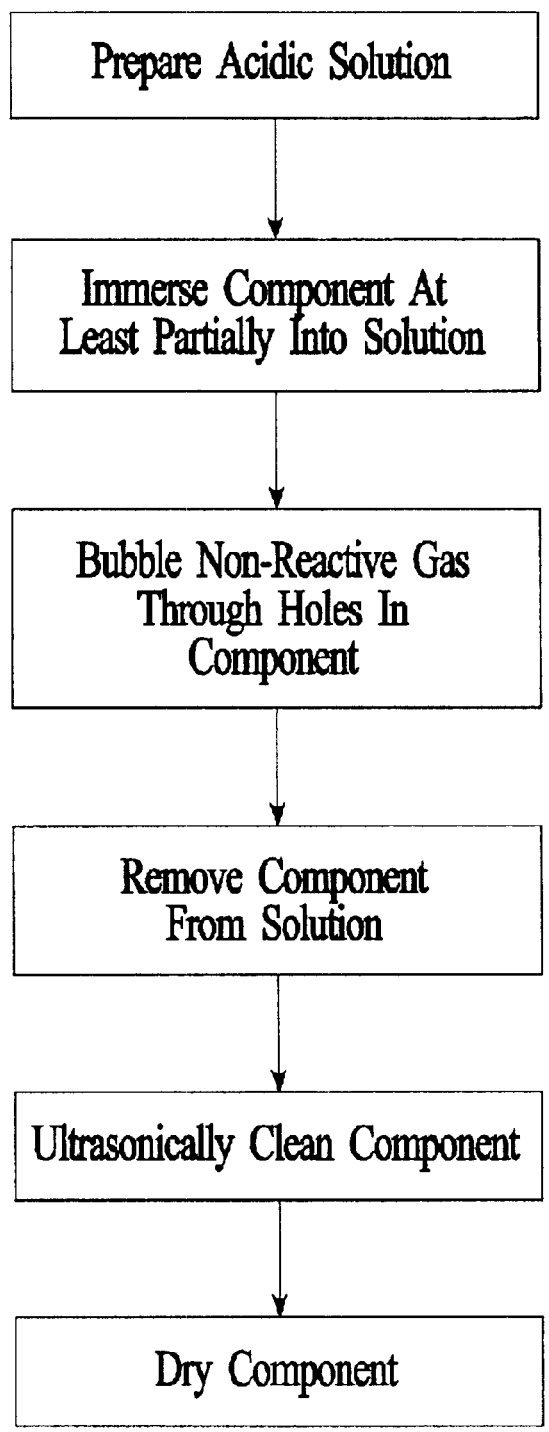

These and other features, aspects, and advantages of the present invention will be better understood from the following drawings, description and appended claims, which illustrate exemplary features of the invention, however, it is to be understood that each of the features may be used in the invention in general, not merely in the context of the particular drawings, and the invention includes any combination of these features, where:

FIG. 1 is a sectional schematic view of a electrostatic chuck component immersed in a cleaning solution while a non-reactive gas is bubbled through gas ports in the chuck; and FIG. 2 is a flow chart of an embodiment of a method according to the present invention.

DESCRIPTION

An exemplary embodiment of an apparatus 10 suitable for cleaning a component 15 according to the present invention is schematically illustrated in FIG. 1. The component 15 may comprise any portion or structure of a process chamber (not shown) that is used in the fabrication of electronic circuits. For example, the process chamber may be an etch chamber to etch material of the substrate, or a CVD or PVD chamber to deposit material on a substrate (not shown), for example, a metal-containing material, such as copper, titanium, or TiN; or a dielectric containing material such as $SiO_2$; and other residues that may be formed in the chamber, such as $AlF_3$. In a typical PVD or sputtering process, a sputtering target comprising the material to be sputtered onto the substrate is positioned facing the substrate. A sputtering gas is introduced into the chamber and energized to form non-reactive or reactive plasma species that sputter material off the target causing the material to deposit along a line-of-sight path onto the substrate and other surfaces in the chamber. In a CVD chamber, a deposition gas is introduced into the chamber and energized to deposit material onto the substrate from the gas phase. For example, an insulator or dielectric material, such as for example, $SiO_2$ or $Si_3N_4$, may be deposited from energized deposition gas comprising one or more of $SiH_4$, $SiCl_2H_2$, $CO_2$, $H_2$, $N_2O$, $Si(OC_2H_5)_4$, $NH_3$ and $N_2$; tungsten-containing material may be deposited from a deposition gas comprising one or more of $WF_6$, $H_2$ and $SiH_4$; molybdenum-containing material may be deposited from a deposition gas comprising $MoCl_5$ and $H_2$; and aluminum-containing material may be deposited from a deposition gas comprising $AlCl_3$ or $Al(CH_3)_3$ mixed with Ar or $H_2$ or both. In the substrate fabrication process, process residues, such as sputtering, CVD, or etch residues typically form on the surfaces of the components 15 in the chamber.

The chamber component 15 may include, for example, the chamber enclosure wall, substrate support, gas distributor, gas energizer, chamber wall liner, focus ring, lift pin, or any other component in the chamber. For example, in one application of the present cleaning process, sputtering process residues which are formed on the exposed portions of an electrostatic chuck 18 that is used to hold a substrate in the chamber, are cleaned from the surfaces of the chuck 18.

The cleaning process is especially useful to clean sputtering deposits comprising titanium nitride that are formed on the electrostatic chuck 18 in a titanium nitride sputter deposition process.

After one or more batches of substrates are processed in the chamber, the electrostatic chuck 18 is removed from the chamber, and at least partially immersed in a cleaning solution 20 comprising hydrofluoric acid and nitric acid in a cleaning solution tank 24, as illustrated in the first step of the flowchart of FIG. 2. The electrostatic chuck 18 is positioned in the cleaning solution 20 of the tank 24 such that the surfaces 28 to be cleaned are immersed in the cleaning solution 20, as for example, illustrated in FIG. 1. In addition to hydrofluoric and nitric acids, the cleaning solution 20 may contain other acidic or basic materials or solvents that would assist in cleaning of the sputtering residues from the electrostatic chuck 18. A suitable concentration of hydrofluoric acid in the solution is at least about 1 percent and a suitable concentration of nitric acid in the solution is at least about 20 percent. During the immersion of the electrostatic chuck 18, the cleaning solution 20 may also be heated, to further enhance cleaning of the process residues on the surfaces of the chuck 18.

After the component 15 is at least partially immersed in the cleaning solution 20, a non-reactive gas from a non-reactive gas source 34 is flowed via conduits 36 connected to the gas inlets 38 through the holes 30 in the component 15, such as helium gas ports in the electrostatic chuck 18, which, during use of the electrostatic chuck 18, allow helium gas to be passed between the surface of the chuck 18 and the overlying substrate held on the chuck 18 to serve as a heat transfer medium. The non-reactive gas is a gas that does not react with the component surfaces or the acidic solution in which the component 15 is immersed. A suitable non-reactive gas is nitrogen, however, other suitable non-reactive gases include argon. The non-reactive gas is flowed through the holes 30 at a pressure regulated by a pressure meter 40 that is sufficiently high to prevent back flow of the acidic solution into the holes 30 during the cleaning step by forming bubbles 42 that emanate from the gas ports. A suitable pressure of the non-reactive gas is at least about 2 psi, and more preferably from about 2 to about 4 psi. A suitable flow rate for the non-reactive gas passing through the holes is at least about 100 sccm.

After immersion of the electrostatic chuck 18 in the acidic solution, the electrostatic chuck 18 is occasionally visually inspected to determine if the sputtering residues have been removed. When cleaning residues are no longer visible, the chuck 18 is removed from the acidic solution for next process step. In the next step, the acidic solution is washed off the chuck 18 in deionized water. Then, the chuck 18 is ultrasonically rinsed in a deionized water bath, and thereafter blowdried with the dry nitrogen. The ultrasonic rinsing steps may also be performed in a deionized water bath that is heated to a temperature of from about 30 to about 40C. The ultrasonic and blow drying steps are repeated until the chuck 18 is visually dry, each time increasing the resistive quality of the deionized water, from for example, about 2 MΩ to about 4 MΩ deionized water and to about 8 MΩ deionized water. Thereafter, the chuck 18 is heated to about 125C for two hours in a nitrogen purged vacuum oven to bake out residual moisture.

The present invention has been described with reference to certain preferred versions thereof; however, other versions are possible. For example, the cleaning process of the present invention may be used for treating chambers for other applications, as would be apparent to one of ordinary skill. For example, the process may be applied to treat components of ion implantation chambers, oxide forming and nitriding chambers, or may be applied in combination with other types of cleaning processes. Therefore, the spirit and scope of the appended claims should not be limited to the description of the preferred versions contained herein.

What is claimed is:

1. A method of cleaning process residues from the a surface of a substrate processing chamber component having holes therein, the method comprising:

(a) at least partially immersing the component into a cleaning solution comprising hydrofluoric acid and nitric acid; and (b) passing a non-reactive gas through the holes in the component, whereby the process residues are at least partially cleaned from the surface of the substrate processing chamber component.

2. A method according to claim 1 wherein the non-reactive gas is flowed through the holes at a pressure that is sufficiently high to prevent back flow of cleaning solution into the holes.

3. A method according to claim 1 wherein the non-reactive gas is flowed through the holes at a pressure of at least about 2 psi.

4. A method according to claim 1 wherein a flow rate of the non-reactive gas passing through the holes is at least about 100 sccm.

5. A method according to claim 1 wherein a concentration of hydrofluoric acid in the cleaning solution is at least about 1 percent.

6. A method according to claim 1 wherein a concentration of nitric acid in the cleaning solution is at least about 20 percent.

7. A method according to claim 1 wherein the non-reactive gas is nitrogen.

8. A method according to claim 1 wherein the component is an electrostatic chuck, and the holes in the component are gas ports.

9. A method of cleaning residues from a surface of an electrostatic chuck having gas ports, the method comprising:

(a) at least partially immersing the electrostatic chuck into a cleaning solution comprising hydrofluoric acid in a concentration of at least about 1 percent and nitric acid in a concentration of at least about 20 percent; and (b) flowing a non-reactive gas through the gas ports in the electrostatic chuck at a pressure of at least about 2 psi, whereby the residues are at least partially cleaned from the surface of the electrostatic chuck.

10. A method according to claim g wherein a flow rate of the non-reactive gas passing through the gas ports is at least about 100 sccm.

11. A method according to claim 9 wherein the non-reactive gas is nitrogen.

12. A method of cleaning sputtering residues from a surface of an electrostatic chuck having gas ports, the method comprising:

(a) at least partially immersing the electrostatic chuck into a cleaning solution comprising hydrofluoric acid in a concentration of at least about 1 percent and nitric acid in a concentration of at least about 20 percent; and (b) flowing nitrogen through the gas ports in the electrostatic chuck at a pressure of at least about 2 psi and a flow rate of at least about 100 sccm, whereby the sputtering residues are at least partially cleaned from the surface of the electrostatic chuck.

* * * * *